United States Patent
Keerti (10) Patent No.: US 7,920,027 B2
(45) Date of Patent: Apr. 5, 2011

(54) AMPLIFIER DESIGN WITH BIASING AND POWER CONTROL ASPECTS

(75) Inventor: Arvind Keerti, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 156 days.

(21) Appl. No.: 12/098,936

(22) Filed: Apr. 7, 2008

(65) Prior Publication Data

US 2009/0251217 A1    Oct. 8, 2009

(51) Int. Cl.
*H03F 3/18* (2006.01)
(52) U.S. Cl. ........................................ 330/264; 330/262
(58) Field of Classification Search .................. 330/264, 330/263, 262
See application file for complete search history.

(56) References Cited

U.S. PATENT DOCUMENTS

| | | | |
|---|---|---|---|
| 5,212,455 A * | 5/1993 | Pernici et al. ................ | 330/253 |
| 5,361,041 A * | 11/1994 | Lish .............................. | 330/255 |
| 6,400,227 B1 | 6/2002 | Goldfarb et al. | |
| 6,525,569 B1 | 2/2003 | Leon | |
| 6,812,777 B2 * | 11/2004 | Tamura et al. ................ | 327/540 |
| 7,088,969 B2 | 8/2006 | Khorram | |
| 2003/0152139 A1 | 8/2003 | Khorram | |
| 2006/0066407 A1 | 3/2006 | Narendra et al. | |

FOREIGN PATENT DOCUMENTS

EP    1081573 A1    3/2001

OTHER PUBLICATIONS

Hayg Dabag et al: "Electrical Stress-free High Gain and High Swing Analog Buffer Using an Adaptive Biasing Scheme" Circuits and Systems, 2007. ISCAS 2007. IEEE International Symposium 0 N, IEEE, PI, May 1, 2007, pp. 945-948, XP031181418 ISBN: 978-1-4244-0920-4 p. 946, right-hand column, line 22—p. 947, left-hand column, line 6; figure 4.

International Search Report and Written Opinion—PCT/US2009/036568, International Search Authority—European Patent Office—Sep. 4, 2009.

Torralba A et al: "Class AB Output Stages for Low Voltage CMOS Opamps with Accurate Quiescent Current Control by Means of Dynamic Biasing" Analog Integrated Circuits and Signal Processing, Kluwer Academic Publishers, BO, vol. 36, No. 1-2, Jul. 1, 2003, pp. 69-77, XP019203877 ISSN: 1573-1979 p. 69, left-hand column, line 2—p. 73, left-hand column, line 12; figures 1-3.

* cited by examiner

*Primary Examiner* — Henry K Choe
(74) *Attorney, Agent, or Firm* — Jiayu Xu (57) ABSTRACT

Techniques for biasing an amplifier using a replica circuit are disclosed. In an embodiment, a replica circuit having substantially the same topology and sizing as a push-pull amplifier circuit is coupled to a main push-pull amplifier circuit. A transistor in the replica circuit may be biased using feedback to generate a predetermined DC output voltage level, and such bias level may be applied to a corresponding transistor in the main push-pull amplifier circuit. In another embodiment, a transistor in a current bias module may be used to bias corresponding transistors in the main push-pull amplifier circuit and the replica circuit. Further techniques are disclosed for configuring the amplifier to have a non-uniform step size with finer resolution at lower power levels and coarser resolution at higher power levels to reduce power consumption at lower power levels.

19 Claims, 8 Drawing Sheets

PRIOR ART

AMPLIFIER DESIGN WITH BIASING AND POWER CONTROL ASPECTS

TECHNICAL FIELD

The disclosure relates to integrated circuits (IC's), and more specifically, to IC amplifier design.

BACKGROUND

Amplifiers are an important building block in integrated circuit (IC) devices such as communications transmitters and receivers. Amplifiers are typically designed to provide a desired gain to an input signal, while minimizing overall power consumption and/or the level of distortion in an output signal. Amplifier design often requires making certain trade-offs to achieve a desired level of performance, e.g., trading off low power consumption for good linearity, or trading off large dynamic range for fine resolution.

It would be desirable to have techniques to relax such design trade-offs to allow for greater design flexibility, as well as to improve overall amplifier performance.

SUMMARY

An aspect of the present disclosure provides an amplifier comprising a main circuit comprising a plurality of transistors, the plurality of transistors comprising a first transistor, the main circuit further comprising an input signal AC-coupled to an input node of the main circuit, said input node coupled to the first transistor, the main circuit further comprising an output signal generated at an output node of the main circuit; and a replica circuit comprising replica transistors that are matched to the plurality of transistors in the main circuit, the replica transistors being coupled to each other in the same way as the plurality of transistors are coupled to each other in the main circuit, the replica circuit having an input node and an output node corresponding to the input node and the output node of the main circuit, the input node of the replica circuit being coupled to the output node of the replica circuit.

Another aspect of the present disclosure provides a method for operating an amplifier circuit, the amplifier circuit comprising a plurality of transistors, the plurality of transistors comprising a first transistor, the amplifier circuit further comprising an input signal AC-coupled to an input node of the amplifier circuit, said input node coupled to the first transistor, the amplifier circuit further comprising an output signal generated at an output node of the amplifier circuit, the method comprising coupling the bias voltage of a first replica transistor in a replica circuit to the first transistor of the amplifier circuit, the replica circuit comprising replica transistors that are matched to the plurality of transistors in the amplifier circuit, the replica transistors being coupled to each other in the same way as the plurality of transistors are coupled to each other in the amplifier circuit, the replica circuit having an input node and an output node corresponding to the input node and the output node of the amplifier circuit, the input node of the replica circuit being coupled to the output node of the replica circuit.

Yet another aspect of the present disclosure provides a method for amplifying a signal to one of a plurality of power levels, the method comprising selectively turning on a plurality of sub-amplifier circuits within an amplifier circuit, the plurality of sub-amplifier circuits comprising a first plurality of sub-amplifier circuits each having a first size, and a second plurality of sub-amplifier circuits each having a second size, the second size larger than the first size.

Yet another aspect of the present disclosure provides an amplifier circuit comprising a plurality of transistors, the plurality of transistors comprising a first transistor, the amplifier circuit further comprising an input signal AC-coupled to an input node of the amplifier circuit, said input node coupled to the first transistor, the amplifier circuit further comprising an output signal generated at an output node of the amplifier circuit, the amplifier comprising: means for coupling the bias voltage of a first replica transistor in a replica circuit to the first transistor of the amplifier circuit, the replica circuit comprising replica transistors that are matched to the plurality of transistors in the amplifier circuit, the replica transistors being coupled to each other in the same way as the plurality of transistors are coupled to each other in the amplifier circuit, the replica circuit having an input node and an output node corresponding to the input node and the output node of the amplifier circuit, the input node of the replica circuit being coupled to the output node of the replica circuit through a feedback module.

DETAILED DESCRIPTION

Figure 1:
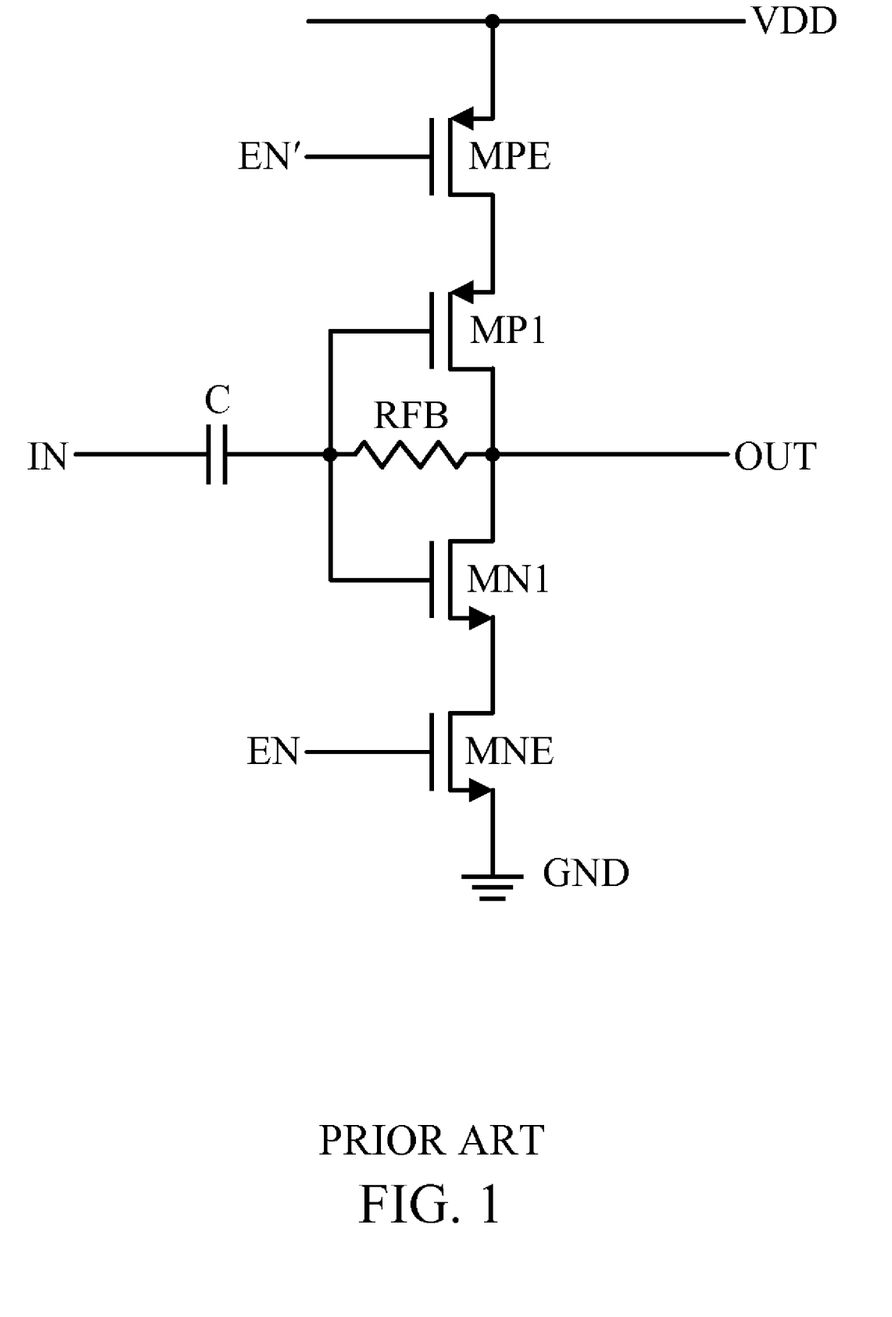
FIG. 1 depicts an implementation of a prior art amplifier employing a digital inverter or "push-pull" architecture.

FIG. 1 depicts a prior art implementation of an amplifier employing a digital inverter or "push-pull" architecture. In FIG. 1, the gates of transistors MP1 and MN1 are shorted together, and the drains of MP1 and MN1 are also shorted together. An input signal IN is AC-coupled to the gates of transistors MP1 and MN1 through capacitor C, while the output signal OUT is available from the drains of MP1 and MN1. Transistors MNE and MPE are series-coupled to MN1 and MP1, and are optionally provided to enable or disable the amplifier based on a control signal EN and complementary control signal EN'. In one implementation, the input and output signals may be radio-frequency (RF) signals.

To ensure that the amplifier stays in the linear operating range, the amplifier is "self-biased," i.e., the input is DC coupled to the output through resistor RFB. While self-biasing is a simple technique for achieving linearity, it generally allows little flexibility to, e.g., adjust the amplifier bias current independently of the linear operating range. Another characteristic of this circuit is that its gain may be sensitive to process variations, as well as to any parasitic resistance between the supply voltage VDD and ground.

Figure 2:
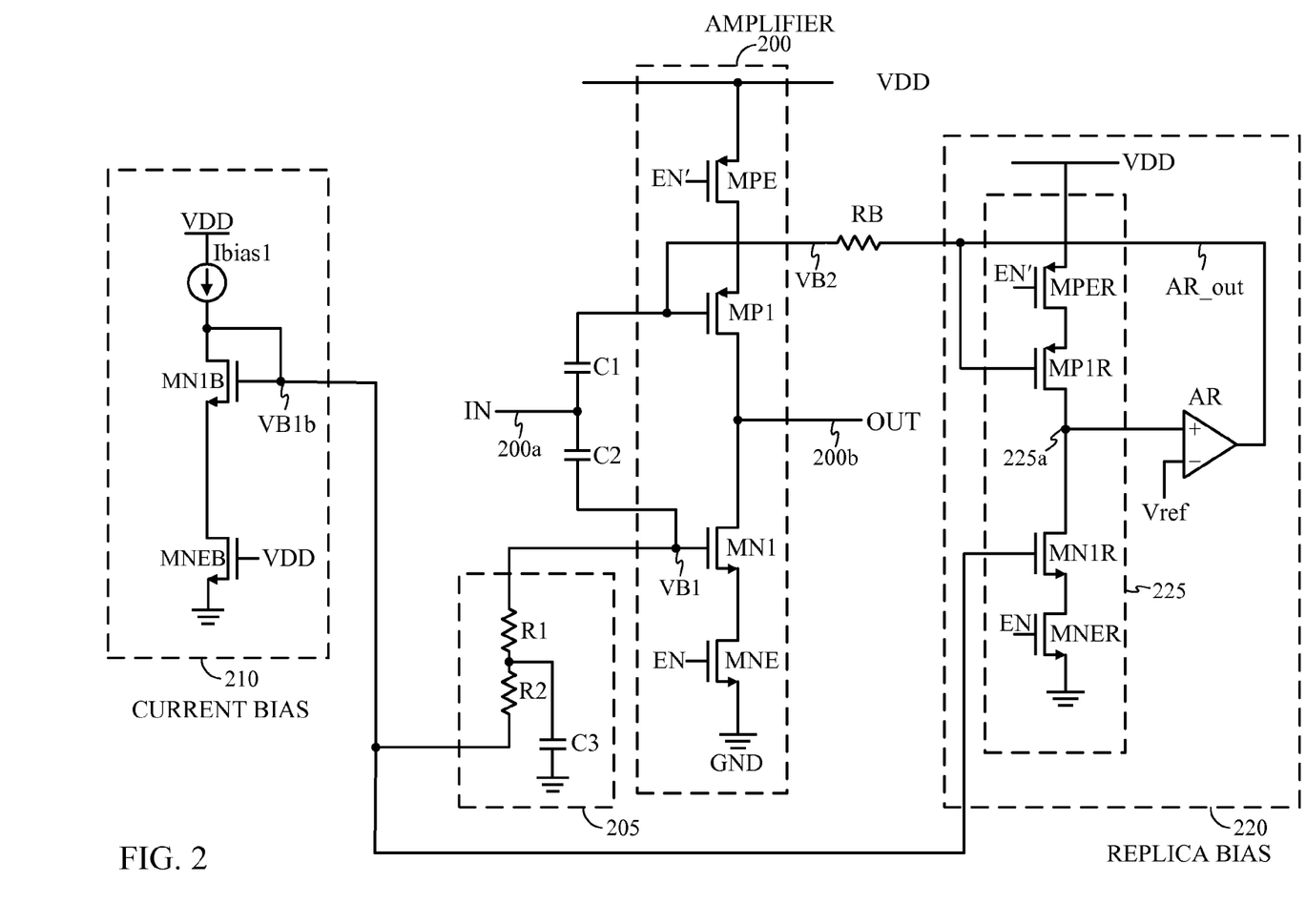
FIG. 2 depicts a circuit according to the present disclosure comprising an amplifier 200, a current bias module 210, and a replica bias module 220.

FIG. 2 depicts an amplifier embodiment according to the present disclosure. The circuit in FIG. 2 comprises an amplifier 200, a current bias module 210, and a replica bias module 220. In the embodiment shown, the NMOS transistor MN1 of amplifier 200 is biased by a voltage VB1 generated by the current bias module 210, and the PMOS transistor MP1 of amplifier 200 is biased by a voltage VB2 generated by the replica bias module 220.

To generate the bias voltage VB1, the current bias module 210 includes a current source Ibias1 coupled in series with transistors MN1B and MNEB. Transistors MN1B and MNEB may be designed to replicate the configuration of transistors MN1 and MNE in amplifier 200, e.g., MN1B and MNEB may be designed to have similar topology and size ratios as MN1 and MNE. The gate of transistor MN1B is coupled to the drain to generate a voltage VB1b, which is coupled to the gate of transistor MN1 as the bias voltage VB1 through RC network 205. RC network 205 is optionally provided between VB1 and VB1b to better isolate the input signal IN from the current bias module 210.

The coupling between voltages VB1b and VB1 fixes the bias current of amplifier 200 to be a multiple of Ibias 1. This multiple may be determined based on the ratio of the size of MN1 to the size of MN1B. Note the transistor MNEB in the bias current module 210 is designed to "replicate" the transistor MNE in the amplifier 200, which allows for greater accuracy in the current mirroring between the current bias module 210 and the amplifier 200.

As earlier described, transistor MP1 is biased by a voltage VB2 generated by replica bias module 220. The replica bias module 220 includes replica transistors MPER, MP1R, MN1R, and MNER that replicate the configuration of the corresponding transistors MPE, MP1, MN1 and MNE in amplifier 200. Collectively, the replica transistors may be referred to as constituting the replica amplifier 225.

In FIG. 2, the replica amplifier 225 generates an appropriate bias voltage VB2 for amplifier 220 as follows. The output node 225a of replica amplifier 225 is coupled to the positive node of a differential amplifier AR, which compares the output voltage of the replica amplifier 225 with a reference voltage Vref. The amplifier AR outputs a voltage AR_out that is fed back to the gate of transistor MP1R. As a result of the feedback, the gate bias of MP1R is adjusted to keep the output voltage 225a of replica amplifier 225 close to the reference voltage Vref. The gate voltage of MP1R, or AR_out, is DC coupled to the gate of transistor MP1 in amplifier 200 as VB2, via resistor RB. Because the DC characteristics of the amplifier 200 are expected to match those of the replica amplifier 225, the DC level of the output voltage OUT of amplifier 200 is expected to match the reference voltage Vref set in the replica bias module 220.

In an embodiment, the sizes of the transistors in the replica amplifier 225 may be identical to, or a fixed multiple of, the sizes of the corresponding transistors in amplifier 200. In another embodiment, amplifier 200 may incorporate multiple instances of transistors MPE, MP1, MN1, and MNE coupled in parallel, and the replica transistors may include a single instance of the parallel-coupled transistors in the main amplifier 200, as is further described with respect to FIG. 7 herein.

To further replicate the characteristics of the amplifier 200, the bias voltage of MN1R in the replica amplifier 225 may be taken from the same voltage used to bias MN1 in the amplifier 200. For example, the gate of transistor MN1R may be coupled to the voltage VB1b generated by the current bias module 210. Also, transistors MNER and MPER of replica amplifier 225 may be biased by the same voltages EN and EN' used to control transistors MNE and MPE of amplifier 200. In an alternative embodiment, MNER may always be biased high, and MPER may always be biased low.

From the above description, one of ordinary skill in the art will realize that various modifications to the circuit topology shown in FIG. 2 may be made while still employing the techniques of the present disclosure. For example, the transistors MNE and MPE may be omitted from alternative embodiments, along with their corresponding replicas in the current bias module and replica bias module. Furthermore, the transistors MNER and MPER may be omitted from the replica biasing circuit altogether, as they can be viewed as short circuits having negligible voltage drop when the transistors are fully turned on. Furthermore, the techniques of the present disclosure may readily be applied to alternatively bias the PMOS transistor MP1 using the current bias module, and the NMOS transistor MN1 using the replica bias module, with the appropriate modifications. Such embodiments are contemplated to be within the scope of the present disclosure.

Figure 3A:
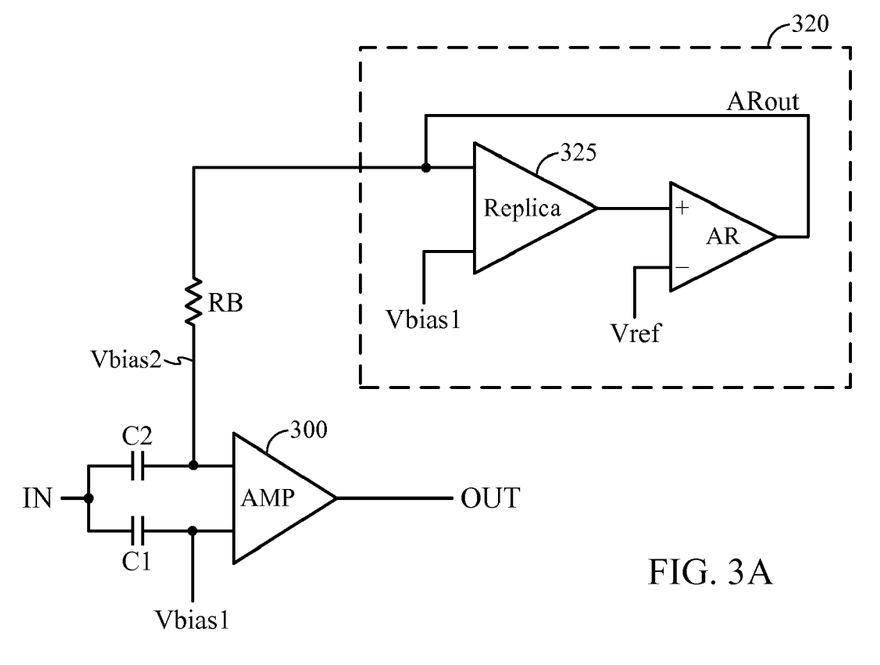
FIG. 3A shows a generic embodiment of replica biasing according to the present disclosure, wherein a generic amplifier 300 is biased using a replica bias module 320.

FIG. 3A shows a generic embodiment of replica biasing according to the present disclosure, wherein a generic amplifier 300 is biased using a replica bias module 320. In general, the amplifier 300 may include transistors coupled using an arbitrary topology, while replica amplifier 325 may include transistors coupled using a topology that "replicates" the topology of amplifier 300. For example, the sizes of the transistors in replica amplifier 325 may be chosen to match those of the transistors in amplifier 300, to within a constant scaling factor. Furthermore, the bias levels of transistors in amplifier 300, including a first bias voltage Vbias1, may also be provided to corresponding transistors in the replica amplifier 325 where possible.

In FIG. 3A, the differential amplifier AR provides negative feedback to adjust the biasing of the replica transistor 325 to produce the desired level Vref at the output of replica amplifier 325. The bias voltage of the replica transistor may then be coupled to the main amplifier 300 as the bias voltage Vbias2 through resistor RB.

Figure 3B:
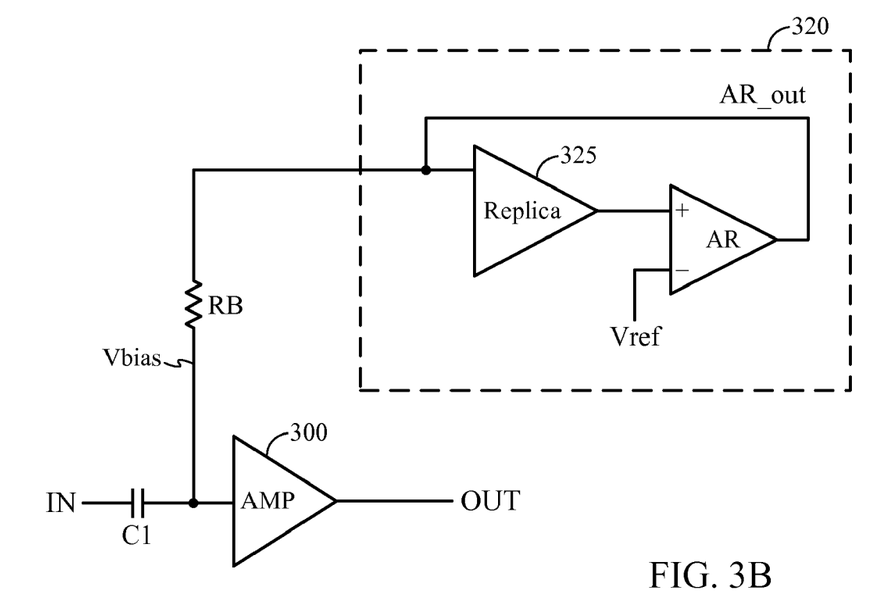
FIG. 3B depicts an alternative embodiment of replica biasing according to the present disclosure, wherein the input signal IN is coupled to the main amplifier 300 by a single AC-coupling capacitor C1.

FIG. 3B depicts an alternative embodiment of replica biasing according to the present disclosure, wherein the input signal IN is coupled to the main amplifier 300 by a single AC-coupling capacitor C1. In FIG. 3B, the feedback configuration of replica amplifier 325 generates a single bias voltage VB to bias the main amplifier 300.

The techniques described hereinabove may be generally be applied to any amplifier application. In an embodiment, they may be applied to the design of driver amplifiers for radio-frequency (RF) transmitters.

Techniques for providing replica circuits for biasing an amplifier have been disclosed hereinabove. Techniques for designing an amplifier circuit using the replica circuits to minimize distortion due to a non-linear coefficient $g_{m3}$ of the constituent transistors are further disclosed hereinbelow.

For common-source NMOS or PMOS amplifiers, the small-signal drain-to-source current ids can be expressed as follows (Equation 1):

$$i_{ds} = g_m v_{gs} + g_{m2} v_{gs}^2 + g_{m3} v_{gs}^3 + \ldots$$

where $v_{gs}$ represents the small-signal gate-to-source voltage, gm represents the first-order device transconductance, $g_{m2}$ represents the second-order device transconductance, etc. The first-order transconductance $g_m$ is usually chosen to provide the amplifier with the desired gain. In integrated circuits, the terms $g_{m2}$ and $g_{m3}$ contribute to non-linear distortion at the amplifier output. According to the present disclosure, by selecting the appropriate device sizes and bias current (or voltage) for active transistors as described below, the term $g_m$ may be selected to provide the desired amplifier gain, while the term $g_{m3}$ may be minimized or cancelled out.

Figure 4:
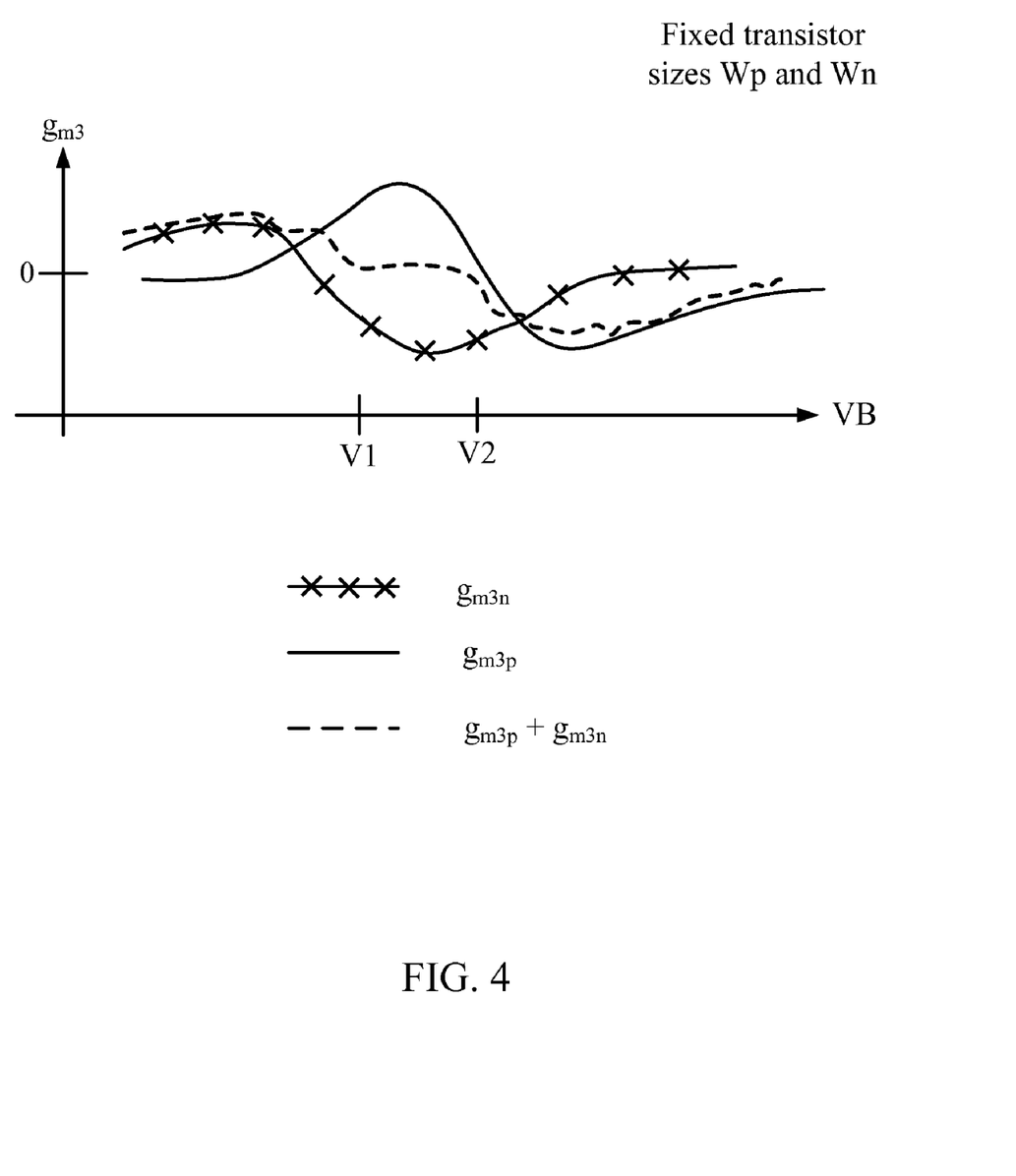
FIG. 4 depicts a plot of the relationship between a non-linear transconductance $g_{m3}$ of the push-pull amplifier and the bias voltage VB1, given fixed sizes $W_p$ and $W_n$ of the constituent transistors MP1 and MN1, respectively.

In an embodiment, the above analysis of common-source amplifiers may be applied to the push-pull amplifier 200 of FIG. 2, which may be considered a common-source NMOS amplifier coupled in parallel to a common-source PMOS amplifier. To illustrate an embodiment of the design procedure for the push-pull amplifier, FIG. 4 depicts a plot of the third-order transconductance $g_{m3}$ of the overall push-pull amplifier 200 of FIG. 2, along with plots of $g_{m3p}$ and $g_{m3n}$ of the constituent active transistors MP1 and MN1, respectively. The transconductance values are plotted versus a bias voltage VB applied to either transistor MP1 or MN1. In FIG. 4, the transistors MP1 and MN1 are assumed to have sizes of $W_p$ and $W_n$, respectively.

Note from FIG. 4 that there is generally a range of bias voltages for either MN1 or MP1, ranging from V1 to V2 shown in FIG. 4, wherein the $g_{m3}$ of the overall push-pull amplifier is close to zero. To design the amplifier, the bias voltage VB may be set to be within this range, while the sizes of transistors MP1 and MN1 are selected to achieve an appropriate $g_{m1}$ for the desired amplifier gain. In an embodiment, the bias voltage VB may be set by a current bias module 210 or a replica bias module 220.

One of ordinary skill in the art will appreciate that the plot in FIG. 4, and hence an appropriate range of voltages V1 to V2, may be known to the circuit designer via, e.g., computer circuit simulation, lab measurements, or any other techniques.

According to a further aspect of the present disclosure, techniques are provided to vary the output power control step size of an amplifier.

Figure 5:
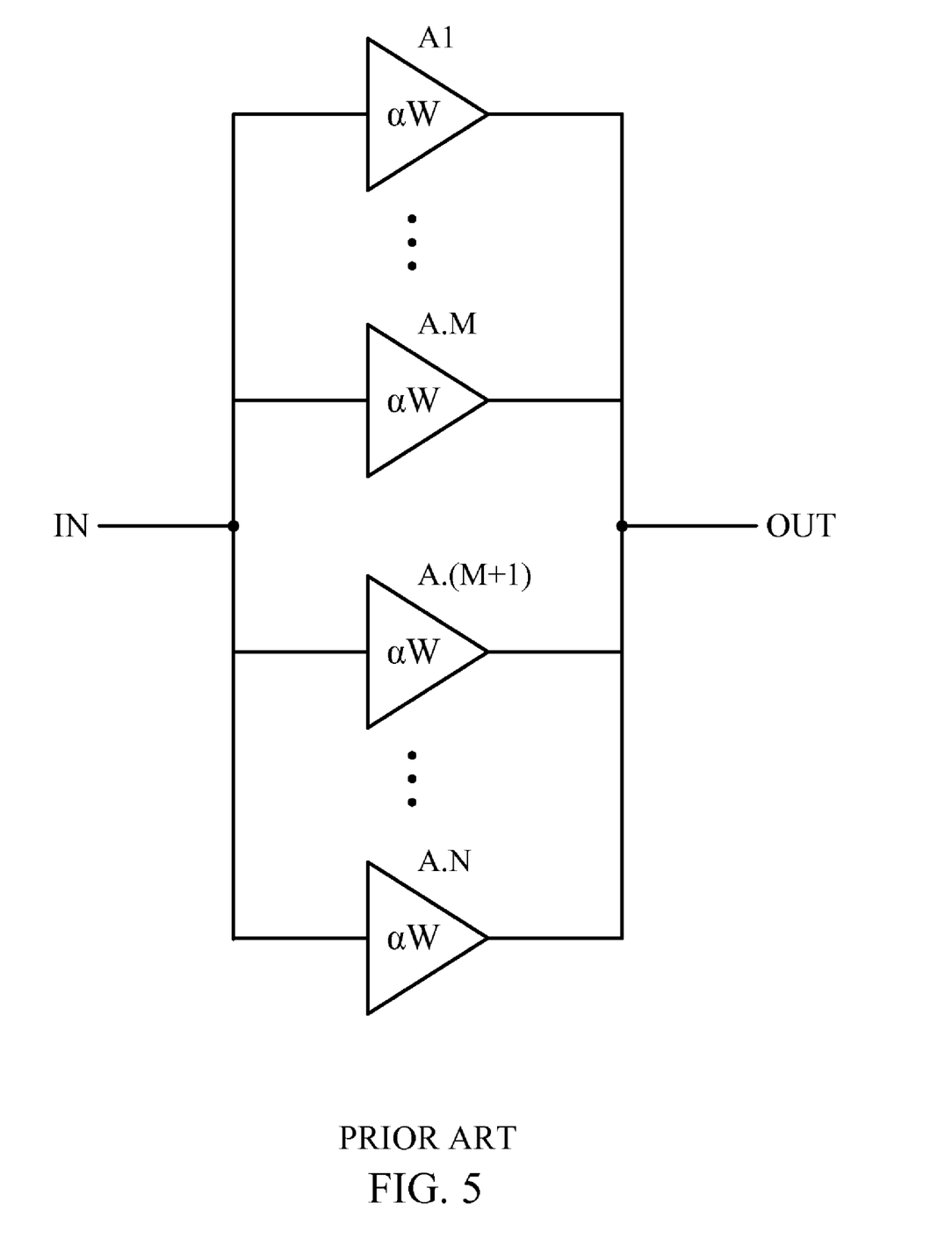
FIG. 5 depicts a prior art implementation of a driver amplifier having a constant power control step size.

FIG. 5 depicts a prior art implementation of a driver amplifier having a constant output power control step size. In FIG. 5, an amplifier includes a plurality N of parallel-coupled sub-amplifiers, each sub-amplifier denoted by A.n, and each sub-amplifier comprising active transistors having width $\alpha W$, wherein $\alpha$ is a scaling constant and W is a size constant. The power level of the amplifier output signal OUT may be controlled by turning on or off a selected subset of the sub-amplifiers. For example, sub-amplifier A.1 is enabled to select the lowest power level, while sub-amplifier A.2 is additionally enabled to select the second lowest power level, etc., until all sub-amplifiers A.1 through A.N are simultaneously enabled to select the highest power level. In the implementation shown, the highest power level corresponds to a total transistor width of N$\alpha$W. Note that since each sub-amplifier has the same associated active transistor width, e.g., $\alpha W$ in FIG. 5, the output power level of the amplifier can be linearly increased in constant increments.

The power level of the amplifier may also be selected by varying one or more bias voltages provided to the sub-amplifiers. In an embodiment, all sub-amplifiers may be provided with a single bias voltage, which may be varied to simultaneously adjust the output power level of all sub-amplifiers.

According to the present disclosure, the power control step size may be made non-uniform over the output power range of the amplifier, such that a smaller step size is provided at lower output power levels, while a larger step size is provided at higher output power levels. In this way, better resolution is provided for lower power levels than for higher output power levels. This may be advantageous as power control levels, such as those for a driver amplifier in a transmitter, are often specified in logarithmic or decibel (dB) units rather than linear units.

Figure 6:
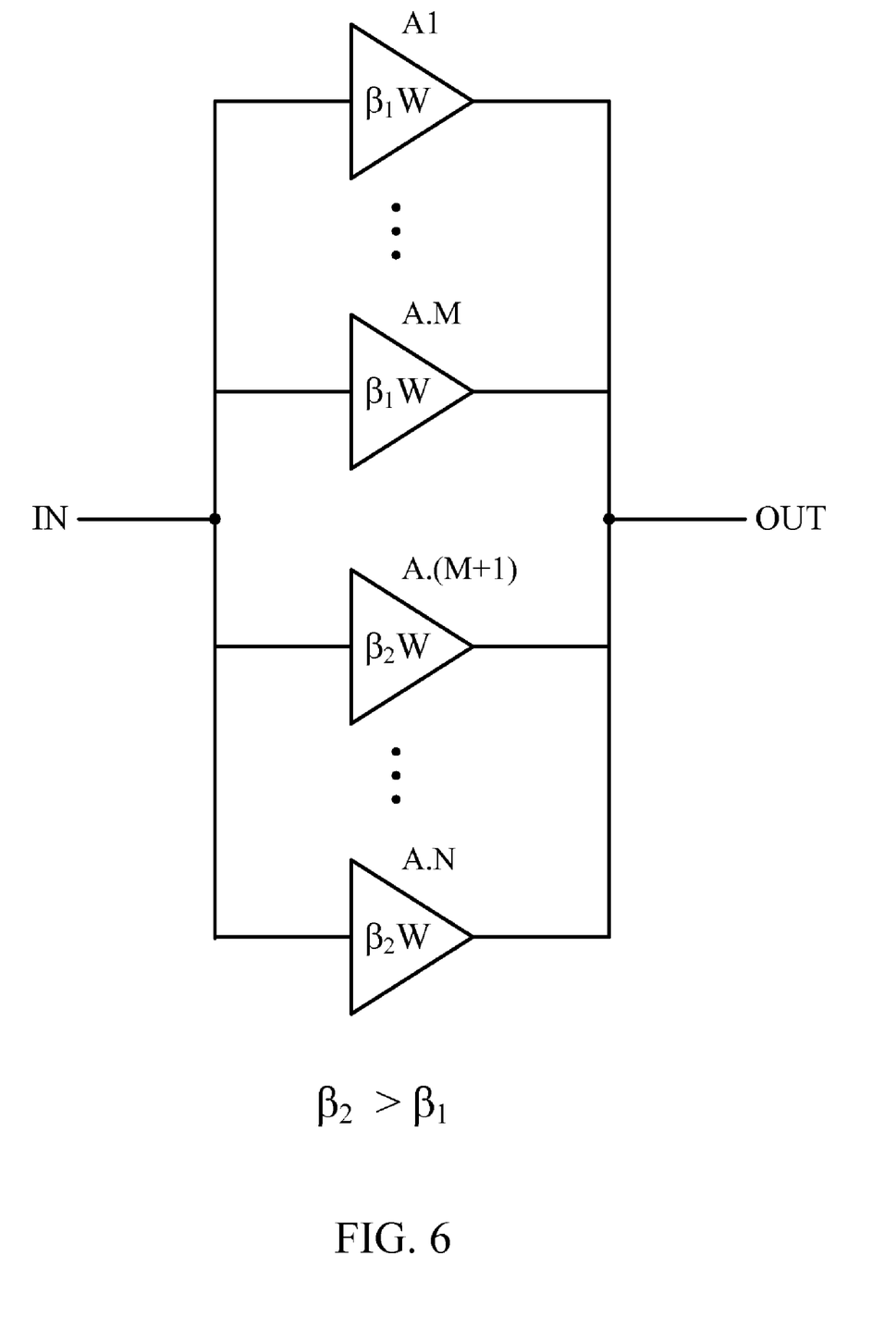
FIG. 6 depicts an embodiment of the present disclosure wherein sub-amplifiers A.1 through A.M each comprise active transistors having size $\beta_1$ W, while sub-amplifiers A.(M+1) through A.N each comprise active transistors having size $\beta_2$ W, wherein $\beta_2 > \beta_1$.

FIG. 6 depicts an embodiment of the present disclosure, wherein sub-amplifiers A.1 through A.M each comprise active transistors having size $\beta_1$ W, while sub-amplifiers A.(M+1) through A.N each comprise active transistors having size $\beta_2$ W, wherein $\beta_2 > \beta_1$. According to the present disclosure, the transmit power levels may be allocated as follows. Sub-amplifier A.1 is enabled to select the lowest power level, while sub-amplifier A.2 is additionally enabled to select the second lowest power level, etc., until sub-amplifiers A.1 through A.M are simultaneously enabled to select the Mth lowest power level. To further increase the power, sub-amplifier A.(M+1) is additionally enabled, and then sub-amplifier A.(M+2), etc., until all sub-amplifiers A.1 through A.N are simultaneously enabled to select the highest power level. In the embodiment shown, the highest power level corresponds to a total transistor width of $[M\beta_1 + (N-M)\beta_2]W$.

From the discussion above, it can be seen that the amplifier output power is controlled in steps of $\beta_1$ W at lower power levels, and $\beta_2$ W at higher power levels. Assuming $\beta_2 > \beta_1$, better resolution is provided for lower power levels than for higher output power levels.

In an embodiment, the highest power level of the embodiment of FIG. 6 may be set equal to the highest power level of the prior art implementation of FIG. 5, such that the maximum achievable power levels of both implementations are the same. In this embodiment, $\beta_2$ and $\beta_1$ are constrained as follows: $[M\beta_1 + (N-M)\beta_2] = \alpha N$. For example, assuming M=N/2, $\alpha$ may be 5, $\beta_1$ may be 3, and $\beta_2$ may be 7. Since the power control step sizes of the embodiment in FIG. 6 are smaller than those of the implementation of FIG. 6 at low output power levels, the corresponding current consumption of the embodiment of FIG. 6 will be lower at low output power levels.

One of ordinary skill in the art will appreciate that according to the present disclosure, the number of distinct step sizes may be greater than the two ($\beta_2$ and $\beta_1$) shown in FIG. 6. The step sizes and corresponding sub-amplifier sizes may monotonically increase with increasing power levels.

Figure 7:
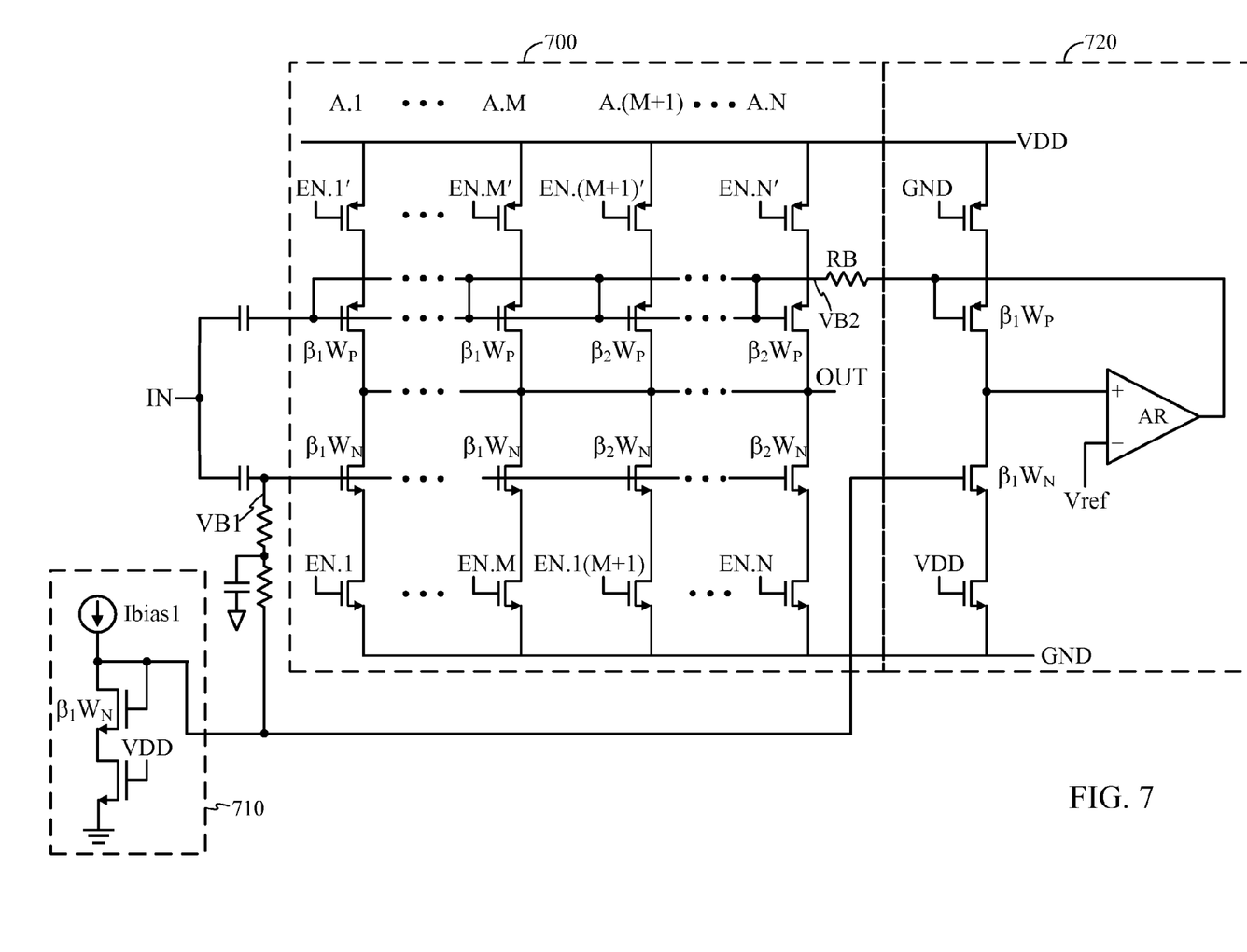
FIG. 7 depicts an embodiment of a push-pull amplifier utilizing various aspects of the present disclosure.

FIG. 7 depicts an embodiment of a push-pull amplifier utilizing various aspects of the present disclosure. In FIG. 7, main amplifier 700 includes a plurality of sub-amplifiers A.1 through A.N. Each of the sub-amplifiers A.n may be enabled or disabled by corresponding control signals EN.n and EN.n'. Sub-amplifiers A.1 through A.M each comprise active PMOS and NMOS transistors with associated transistor widths of $\beta_1 W_p$ and $\beta_1 W_n$ respectively, while sub-amplifiers A.(M+1) through A.N each comprise active transistors with associated widths of $\beta_2 W_p$ and $\beta_2 W_n$.

In FIG. 7, the active NMOS transistor of each sub-amplifier is biased by a gate voltage VB1 derived from the current bias module 710, as earlier described herein. The active PMOS transistor of each sub-amplifier is biased by a gate voltage VB2 derived from the replica bias module 720, as earlier described herein. In an embodiment, the current bias module 710 and replica bias module 720 may use transistor sizes of $\beta_2$ or $\beta_1$ for biasing. In an embodiment, the bias modules may use the lower of $\beta_2$ or $\beta_1$ for greater accuracy in biasing.

Figure 8:
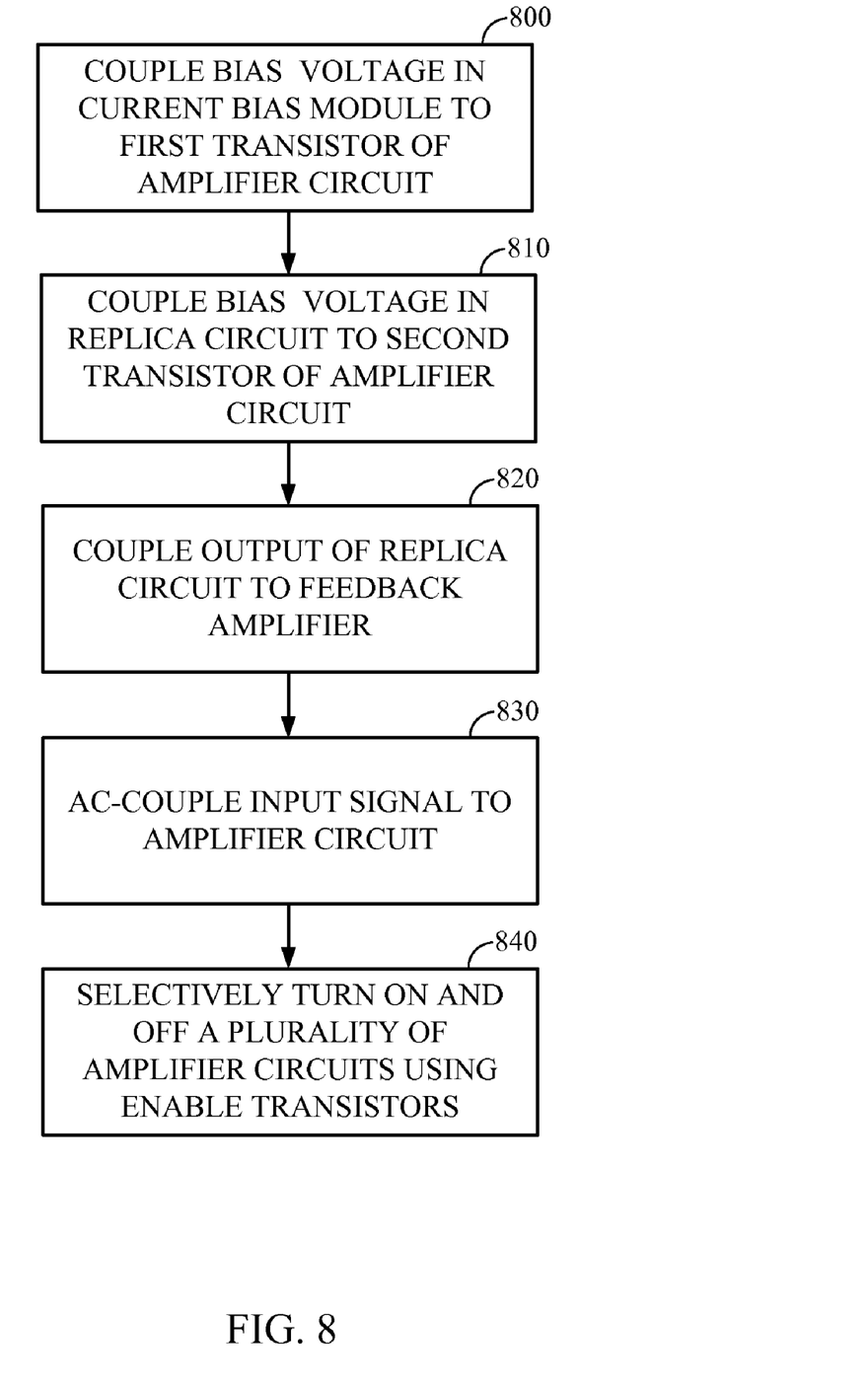
FIG. 8 depicts an embodiment of a method according to the present disclosure.

FIG. 8 depicts an embodiment of a method according to the present disclosure. In FIG. 8, a bias voltage in the current bias module is coupled to a first transistor of the amplifier circuit at step 800. At step 810, a bias voltage in the replica circuit is coupled to a second transistor in the amplifier circuit. At step 820, an output of the replica circuit is coupled to the feedback amplifier. At step 830, an input signal is AC-coupled to the amplifier circuit. At step 840, a plurality of the amplifier circuits so described are selectively turned on and off using enable transistors.

Based on the teachings described herein, it should be apparent that an aspect disclosed herein may be implemented independently of any other aspects and that two or more of these aspects may be combined in various ways. In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. An apparatus comprising:
    a main circuit comprising a main NMOS transistor and a main PMOS transistor configured as a push-pull amplifier; and
    a replica circuit comprising a replica NMOS transistor and a replica PMOS transistor configured as a push-pull amplifier, the output of the replica circuit coupled to the gate of at least one replica transistor to bias the at least one replica transistor, the gate of the at least one replica transistor further coupled to the gate of a corresponding main transistor.

2. The apparatus of claim 1, the main transistors having widths that are a fixed multiple of the corresponding replica transistors.

3. The apparatus of claim 1, the apparatus being a driver amplifier for a transmitter.

4. The apparatus of claim 1, the main circuit configured to amplify radio-frequency (RF) signals.

5. The apparatus of claim 1, the output of the replica circuit coupled to the gate of the replica PMOS transistor, the gate of the replica PMOS transistor further coupled to the gate of the main PMOS transistor to bias the main PMOS transistor.

6. The apparatus of claim 1, the output of the replica circuit coupled to the gate of the replica NMOS transistor, the gate of the replica NMOS transistor further coupled to the gate of the main NMOS transistor to bias the main NMOS transistor.

7. The apparatus of claim 1, an input signal to the main circuit AC-coupled to the gate of the main NMOS transistor and the gate of the main PMOS transistor.

8. The apparatus of claim 1, the output of the replica circuit coupled to the at least one replica transistor through a feedback module, the feedback module comprising a feedback amplifier for adjusting the bias voltage at the gate of the at least one replica transistor to drive the output voltage of the replica circuit to a reference voltage.

9. The apparatus of claim 8, further comprising a current bias module, the gate of the main NMOS transistor coupled to the current bias module, the current bias module comprising a current source series-coupled to a diode-connected first mirror NMOS transistor, the gate bias of the main NMOS transistor coupled to the gate of the first mirror NMOS transistor.

10. The apparatus of claim 9, the gate of the first mirror NMOS transistor coupled to the gate of the NMOS replica transistor.

11. The apparatus of claim 1, further comprising:
    at least one enable transistor series-coupled to the main circuit; the at least one enable transistor configured to selectively turn on or off the main amplifier circuit in response to an enable signal.

12. The apparatus of claim 11, the at least one enable transistor comprising an NMOS transistor series-coupled to the main NMOS transistor, and a PMOS transistor series-coupled to the main PMOS transistor.

13. The apparatus of claim 1, the main circuit comprising a plurality of sub-amplifier circuits, wherein each of the plurality of sub-amplifier circuits is configured to be selectively turned on or off 14. The apparatus of claim 1, the main circuit comprising a plurality of sub-amplifier circuits, the plurality of sub-amplifier circuits comprising a first plurality of sub-amplifier circuits each having a first size, and a second plurality of sub-amplifier circuits each having a second size, the second size being larger than the first size.

15. The apparatus of claim 14, wherein:
    the first plurality of sub-amplifier circuits is configurable to generate a first plurality of power levels; and
    the second plurality of sub-amplifier circuits is configurable to generate a second plurality of power levels, each of the second plurality of power levels being higher than each of the first plurality of power levels.

16. The apparatus of claim 1, the main circuit comprising a plurality of push-pull amplifier circuits, each push-pull amplifier circuit series-coupled to at least one enable transistor, each of the plurality of at least one enable transistors configured to selectively turn on each of the plurality of push-pull amplifier circuits in response to a selective enable signals.

17. The apparatus of claim 14, the first size corresponding to a first NMOS width and a first PMOS width, the second size corresponding to a second NMOS width and a second PMOS width, the ratio between the first NMOS width and the second NMOS width being equal to the ratio between the first size and the second size, the ratio between the first PMOS width and the second PMOS width also being equal to the ratio between the first size and the second size.

18. The apparatus of claim 14, the plurality of push-pull amplifier circuits further comprising a third plurality of push-pull amplifier circuits each having a third size, each of the third plurality of push-pull amplifier circuits configured to be selectively turned on or off by a corresponding enable transistor, the third size being larger than the second size and the first size.

19. The apparatus of claim 9, the current bias module generating a bias voltage to minimize a higher-than-first-order transconductance of a transistor in the main circuit.

* * * * *